United States Patent
Jayaraman et al.

(10) Patent No.: US 9,859,253 B1
(45) Date of Patent: Jan. 2, 2018

(54) INTEGRATED CIRCUIT PACKAGE STACK

(71) Applicant: Intel Corporation, Santa Clara, CA (US)

(72) Inventors: Saikumar Jayaraman, Chandler, AZ (US); John S. Guzek, Chandler, AZ (US); Yidnekachew S. Mekonnen, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/196,937

(22) Filed: Jun. 29, 2016

(51) Int. Cl.
| | |
|---|---|
| *H01L 23/31* | (2006.01) |
| *H01L 23/48* | (2006.01) |
| *H01L 23/52* | (2006.01) |
| *H01L 25/065* | (2006.01) |
| *H01L 23/522* | (2006.01) |
| *H01L 25/00* | (2006.01) |

(Continued)

(52) U.S. Cl.
CPC ........ *H01L 25/0657* (2013.01); *H01L 21/563* (2013.01); *H01L 21/76838* (2013.01); *H01L 23/3142* (2013.01); *H01L 23/481* (2013.01); *H01L 23/5226* (2013.01); *H01L 24/11* (2013.01); *H01L 24/17* (2013.01); *H01L 24/81* (2013.01); *H01L 25/50* (2013.01); *H01L 2224/0231* (2013.01); *H01L 2224/0237* (2013.01); *H01L 2224/16146* (2013.01); *H01L 2224/85815* (2013.01); *H01L 2225/06513* (2013.01); *H01L 2225/06517* (2013.01); *H01L 2225/06548* (2013.01); *H01L 2924/14* (2013.01)

(58) Field of Classification Search
CPC . H01L 25/0657; H01L 25/50; H01L 23/3142; H01L 23/481; H01L 23/5226; H01L 24/11; H01L 24/17; H01L 24/81
See application file for complete search history.

(56) References Cited

U.S. PATENT DOCUMENTS

| | | | |
|---|---|---|---|
| 7,598,607 B2 * | 10/2009 | Chung | ................ H01L 23/3128 257/686 |
| 7,960,827 B1 * | 6/2011 | Miller, Jr. | ........... H01L 23/3677 257/712 |

(Continued)

OTHER PUBLICATIONS

International Search Report and Written Opinion dated Aug. 31, 2017 for International Application No. PCT/US2017/034761, 15 pages.

*Primary Examiner* — Ida M Soward
(74) *Attorney, Agent, or Firm* — Schwabe, Williamson & Wyatt, P.C.

(57) ABSTRACT

Apparatuses, methods and systems associated with integrated circuit (IC) package design are disclosed herein. An IC package stack may include a first IC package and a second IC package. The first IC package may include a first die and a first redistribution layer that communicatively couples contacts on the first side of the first IC package to the first die and to contacts on a second side of the first IC package, the second side opposite to the first side. The second IC package may be mounted to the second side of the first IC package. The second IC package may include a second die and a second redistribution layer that communicatively couples contacts on a side of the second IC package to the second die, the contacts of the second IC package communicatively coupled to the contacts on the second side of the first IC package.

14 Claims, 6 Drawing Sheets

(51) Int. Cl.
   *H01L 21/56*  (2006.01)
   *H01L 23/00*  (2006.01)
   *H01L 21/768* (2006.01)

(56) References Cited

U.S. PATENT DOCUMENTS

| | | | | |
|---|---|---|---|---|
| 8,633,059 | B2* | 1/2014 | Do | H01L 23/13 |
| | | | | 257/678 |
| 8,749,040 | B2* | 6/2014 | Chi | H01L 25/0657 |
| | | | | 257/686 |
| 8,823,180 | B2* | 9/2014 | Wang | H01L 25/105 |
| | | | | 257/737 |
| 8,941,222 | B2* | 1/2015 | Hunt | H01L 21/565 |
| | | | | 257/678 |
| 9,184,128 | B2* | 11/2015 | Hung | H01L 23/5226 |
| 9,368,566 | B2* | 6/2016 | Lee | H01L 28/40 |
| 9,502,272 | B2* | 11/2016 | Kim | H01L 23/3128 |
| 9,548,289 | B2* | 1/2017 | Lin | H01L 25/0652 |
| 2009/0127686 | A1 | 5/2009 | Yang et al. | |
| 2009/0206464 | A1 | 8/2009 | Chung et al. | |
| 2010/0133704 | A1* | 6/2010 | Marimuthu | H01L 21/565 |
| | | | | 257/778 |
| 2011/0068453 | A1* | 3/2011 | Cho | H01L 21/565 |
| | | | | 257/686 |
| 2011/0237004 | A1 | 9/2011 | Lee et al. | |
| 2012/0168944 | A1* | 7/2012 | Gan | H01L 25/16 |
| | | | | 257/738 |
| 2012/0211896 | A1* | 8/2012 | Jeung | H01L 21/4853 |
| | | | | 257/774 |
| 2012/0241957 | A1* | 9/2012 | Koon | H01L 23/49861 |
| | | | | 257/738 |
| 2012/0248600 | A1 | 10/2012 | Shigezane et al. | |
| 2015/0348957 | A1* | 12/2015 | Lin | H01L 21/568 |
| | | | | 438/107 |
| 2015/0364404 | A1* | 12/2015 | Chen | H01L 23/544 |
| | | | | 257/759 |
| 2016/0099231 | A1 | 4/2016 | Yang et al. | |
| 2016/0276307 | A1* | 9/2016 | Lin | H01L 21/561 |
| 2016/0322332 | A1* | 11/2016 | Kim | H01L 23/16 |
| 2017/0053898 | A1* | 2/2017 | Yeh | H01L 25/0657 |
| 2017/0084589 | A1* | 3/2017 | Kuo | H01L 25/105 |
| 2017/0141041 | A1* | 5/2017 | Lin | H01L 23/3114 |
| 2017/0141088 | A1* | 5/2017 | Zhai | H01L 23/3128 |
| 2017/0154858 | A1* | 6/2017 | Tsai | H01L 23/562 |
| 2017/0207197 | A1* | 7/2017 | Yu | H01L 25/0657 |
| 2017/0243826 | A1* | 8/2017 | Lin | H01L 23/5389 |

* cited by examiner

INTEGRATED CIRCUIT PACKAGE STACK

TECHNICAL FIELD

The present disclosure relates to the field of electronic circuits. More particularly, the present disclosure relates to integrated circuit package design.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

As integrated circuit (IC) designs increase in performance and space demands for circuit topology, three-dimensional chip packaging has emerged as an option for limiting circuit board space used by components on a circuit board. Legacy three-dimensional chip packaging involved positioning of multiple dies within a single IC package and coupling the dies through wire bonds or through-die vias.

This legacy three-dimensional chip packaging required the multi-die three-dimensional chip package to be completely manufactured before testing could be performed on the dies. At times, a die within the three-dimensional chip package would fail to operate as intended, resulting in the entire three-dimensional chip package, including any properly operating dies within the three-dimensional chip package, being rejected and disposed of. The rejection and disposal of properly operating components may result in lost profits and lower cost efficiency.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
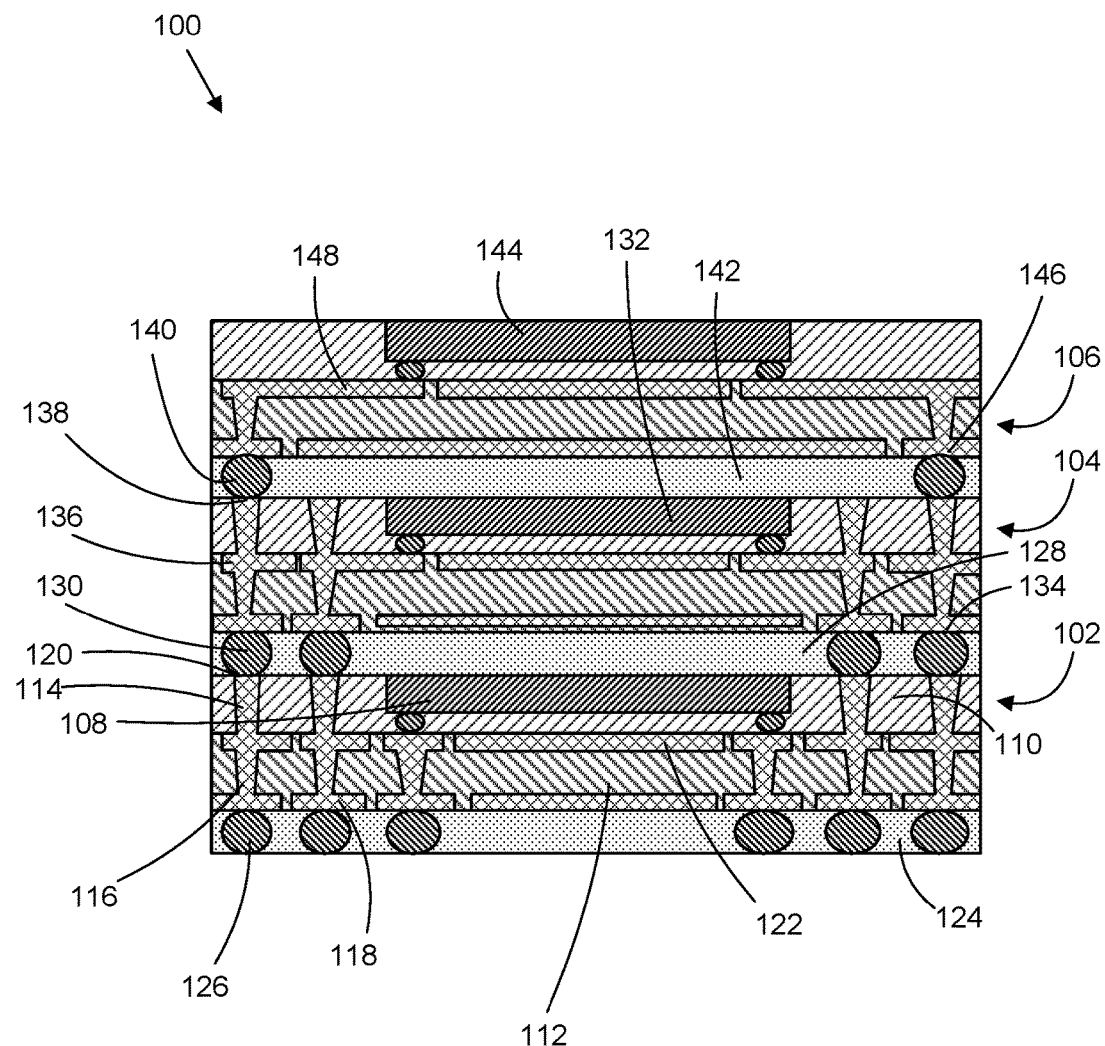
FIG. 1 illustrates an example integrated circuit package stack, according to various embodiments.

Apparatuses, methods and systems associated with integrated circuit (IC) package design are disclosed herein. In embodiments, an IC package stack may include a first IC package and a second IC package. A first side of the first IC package may be to be mounted to a circuit board. The first IC package may include a first die and a first redistribution layer that communicatively couples contacts on the first side of the first IC package to the first die and to contacts on a second side of the first IC package, the second side opposite to the first side. The second IC package may be mounted to the second side of the first IC package. The second IC package may include a second die and a second redistribution layer that communicatively couples contacts on a side of the second IC package to the second die, the contacts of the second IC package communicatively coupled to the contacts on the second side of the first IC package.

In the following detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Aspects of the disclosure are disclosed in the accompanying description. Alternate embodiments of the present disclosure and their equivalents may be devised without parting from the spirit or scope of the present disclosure. It should be noted that like elements disclosed below are indicated by like reference numbers in the drawings.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The description may use the phrase "communicatively coupled." The phrase may mean that an electrical signal may propagate among the elements that are communicatively coupled.

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

FIG. 1 illustrates an example integrated circuit (IC) package stack 100, according to various embodiments. The IC package stack 100 may include two or more IC packages. FIG. 1 is illustrated with three IC packages: first IC package 102, second IC package 104, and third IC package 106, however, it is to be understood that the IC package stack 100 is not limited to including three IC packages and may include more or less IC packages. Each IC package in the IC package stack 100 may be manufactured and/or tested independently prior to mounting each of the IC packages in the IC package stack 100.

For clarity, features of the first IC package 102 are described below for understanding of an example IC package that may be utilized and/or implemented within the IC package stack 100. It is to be understood that one or more of the IC packages within the IC package stack 100 (such as the second IC package 104 and/or the third IC package 106) may include one or more of the features described in relation to the first IC package 102. Further, it is to be understood that one or more of the IC packages within the IC package stack 100 may include additional and/or varying features from the description of the first IC package 102, and may include any device that one having ordinary skill in the art would consider and/or refer to as an IC package. Additionally, while a single type of IC package is described in relation to the first IC package 102, it is to be understood that other types of IC packages may be included in the IC package stack 100. For a non-limiting example, the first IC package 102 may be a fan-out wafer level chip scale package, a system-on-chip package, a system-in-package, or some combination thereof.

The first IC package 102 may include a first die 108. The first die 108 may be a memory die. In some embodiments, the first die 108 may be a logic die. The first die 108 may be embedded in a first molded layer 110 of the first IC package 102. The first die 108 may be located toward an upper portion of the first molded layer 110 and toward an upper side of the first IC package 102. The first molded layer 110 and/or the first die 108 may be located at an upper side of the first IC package 102, with the lower side of the first IC package 102 to be mounted to or mounted toward a circuit board onto which the IC package stack 100 is mounted.

The first IC package 102 may include a first substrate 112. The first substrate 112 may be located between the first molded layer 110 and the lower side of the first IC package 102. The first substrate 112 may be silicon, metal oxide, gallium arsenide, or some combination thereof. The first substrate 112 may serve as a foundation of the first IC package 102 onto which the other elements, including the first molded layer 110 and/or the first die 108, of the first IC package 102 may be affixed. In some embodiments, the first IC package 102 may not include the first substrate 112, in which case the first molded layer 110 may extend from the upper side of the first IC package 102 to the lower side of the first IC package 102.

The first IC package 102 may include one or more vias, including first upper vias 114 and/or first lower vias 116. The one or more vias may communicatively couple one or more first lower contacts 118, located on the lower side of the first IC package 102, to one or more first upper contacts 120, located on the upper side of the first IC package 102. The first upper vias 114 may be formed in the first molded layer 110 and the first lower vias 116 may be formed in the first substrate 112 of the first IC package 102. The first upper layer vias 114 may extend within the first molded layer 110 around the first die 108, such that the first upper layer vias 114 do not pass through the first die 108. In some embodiments, including embodiments where the first substrate 112 is omitted, one or both of the first upper vias 114 and/or the first lower vias 116 may be omitted.

The first IC package 102 may include a first redistribution layer 122. The first redistribution layer 122 may be located between the first molded layer 110 and the first substrate 112. The first redistribution layer 122 may be communicatively coupled to the first upper contacts 120 and the first lower contacts 118. Further, the redistribution layer 122 may be communicatively coupled to the first die 108 and may route signals among the first lower contacts 118, the first upper contacts 120, and/or the first die 108.

The first redistribution layer 122 may be formed of a conductive material, such as a conductive metal layer, which may include a copper layer. The first redistribution layer 122 may include a plurality of traces for selectively routing signals among the first lower contacts 118, the first upper contacts 120, and/or the first die 108. The first redistribution layer 122 may be communicatively coupled to the first upper contacts 120 and/or the first lower contacts 118 by the first upper vias 114 and/or the first lower vias 116, respectively. The first redistribution layer 122 may be communicatively coupled to the first die 108 by an electrically conductive material, such as one or more solder balls, conductive adhesive, and/or conductive anisotropic film.

The first redistribution layer 122 may selectively route signals from the first lower contacts 118 to the first upper contacts 120, and vice versa. For example, the first redistribution layer 122 may be communicatively coupled to one of the first lower contacts 118 and communicatively coupled to one of the first upper contacts 120, but not communicatively coupled to the rest of the first upper contacts 120. Accordingly, the first redistribution layer 122 may selectively route the signal from the one of the first lower contacts 118 to the one of the first upper contacts 120, but may not route the signal to the rest of the first upper contacts 120. The redistribution layer 122 may be formed to selectively communicatively couple first upper contacts 120 and/or the first lower contacts 118 to the first die 108, and, accordingly, may selectively route signals among the first upper contacts 120, the first lower contacts 118, and/or the first die 108. The first redistribution layer 122 may have a layout that selectively communicatively couples the first lower contacts 118 to the first upper contacts 120 and/or the first die 108. The layout of the first redistribution layer 122 may be based on the selective routing of the signals among the first upper contact 120, the first lower contacts 118, and/or the first die 108.

A first ball grid array (BGA) 126 may be affixed to the lower side of the first IC package 102. The first BGA 126 may be affixed to the first lower contacts 118 and may be used to communicatively couple the first lower contacts 118 to a circuit board on which the IC package stack 100 is to be mounted. In some embodiments, the first BGA 126 may be omitted if the circuit board to which the IC package stack 100 is to be mounted includes a BGA for mounting the IC package stack 100. The first BGA 126 may include one or more solder balls, conductive adhesive, conductive anisotropic film, or some combination thereof. In some embodiments where the first IC package 102 is mounted to another IC package on the lower side of the first IC package 102, the first BGA 126 may communicatively couple the first lower contacts 118 to contacts of the other IC package rather than to the circuit board.

A first under-fill layer 124 may be formed on the lower side of the first IC package 102. The first under-fill layer 124 may include any material utilized in an under-fill process known by one having skill in the art. The first under-fill layer 124 may partially encircle the first BGA 126. The first under-fill layer 124 may be formed on the lower side of the first IC package 102 after the first IC package 102 is mounted to the circuit board and/or the IC package stack 100 is mounted to the circuit board. In some embodiments where the first IC package 102 is mounted to another IC package on the lower side of the first IC package 102, the first under-fill layer 124 may be formed between the first IC package 102 and the other IC package, and may be formed after the first IC package 102 is mounted to the other IC package.

The IC package stack 100 may include the second IC package 104 mounted to the first IC package 102. The second IC package 104 may be mounted to the upper side of the first IC package 102. A lower side of the second IC package 104 may abut the upper side of the first IC package 102. The lower side of the second IC package 104 may be toward a circuit board to which the IC package stack 100 may be mounted, while an upper side of the second IC package 104 is away from the circuit board when the IC package stack 100 is mounted. The second IC package 104 may be mounted to the first IC package 102 by a second BGA 130, a second under-fill layer 128, or some combination thereof. The second BGA 130 and the second under-fill layer 128 may include one or more of the features of the first BGA 126 and the first under-fill layer 124, respectively.

The second IC package 104 may include one or more of the features of the first IC package 102. The second IC package 104 may include a second die 132. The second die 132 may be a same type of die as the first die 108. For example, the first die 108 may be a memory die and the second die 132 may also be a memory die. In some embodiments, the second die 132 may be a different type of die than the first die 108. For example, the first die 108 may be a memory die and the second die 132 may be a logic die.

The second IC package 104 may include one or more second lower contacts 134 on the lower side of the second IC package 104. The second lower contacts 134 may be communicatively coupled to the first upper contacts 120 by the second BGA 130. The one or more second lower contacts 134 may be positioned and/or formed at locations corresponding to the first upper contacts 120, such that when the second IC package 104 is mounted to the first IC package 102 the second lower contacts 134 align with the first upper contacts 120.

The second IC package 104 may include a second redistribution layer 136. The second redistribution layer 136 may include one or more of the features of the first redistribution layer 122. The second redistribution layer 136 may selectively communicatively couple the second lower contacts 134 to second upper contacts 138 and/or the second die 132. A layout of the second redistribution layer 136 may be different from a layout of the first redistribution layer 122. The second redistribution layer 136 may be formed with a layout based on the layout of the first distribution layer 122 and/or the first upper contacts 120. The layout of the second redistribution layer 136 may be formed based on the selected signal routings among the second lower contacts 134, the second upper contacts 138, and/or the second die 132. The layout of the second redistribution layer 136 may be formed based further on the selected signal routings of the first IC package 102. In some embodiments, the second redistribution layer 136 may have a same layout as the first redistribution layer 122.

The IC package stack 100 may further include the third IC package 106 mounted to the upper side of the second IC package 104. A lower side of the third IC package 106 may be mounted to the upper side of the second IC package 104. The lower side of the third IC package 106 may be located toward a circuit board to which the IC package stack 100 may be mounted. An upper side of the third IC package 106 may be located away from the circuit board. The third IC package 106 may be mounted to the second IC package 104 by a third BGA 140 and/or a third under-fill layer 142. The third BGA 140 may include one or more of the features of the first BGA 126 and/or the second BGA 130, and the third under-fill layer 142 may include one or more features of the first under-fill layer 124 and/or the second under-fill layer 128.

The third IC package 106 may include one or more of the features of the first IC package 102 and/or the second IC package 104. The third IC package 106 may include a third die 144. The third die 144 may be a same type of die as the first die 108 and/or the second die 132. For example, the first die 108 may be a memory die and the third die 144 may also be a memory die. In some embodiments, the third die 144 may be a different type of die than the first die 108 and/or the second die 132. For example, the first die 108 may be a memory die and the third die 144 may be a logic die.

The third IC package 106 may include one or more third lower contacts 146 on the lower side of the third IC package 106. The third lower contacts 146 may be communicatively coupled to the second upper contacts 138 by the third BGA 140. The one or more third lower contacts 146 may be positioned and/or formed at locations corresponding to the second upper contacts 138, such that when the third IC package 106 is mounted to the second IC package 104 the third lower contacts 146 align with the second upper contacts 138.

The third IC package 106 may include a third redistribution layer 148. The third redistribution layer 148 may include one or more of the features of the first redistribution layer 122 and/or the second redistribution layer 136. The third redistribution layer 148 may selectively communicatively couple the third lower contacts 146 to the third die 144. A layout of the third redistribution layer 148 may be different from a layout of the first redistribution layer 122 and/or a layout of the second redistribution layer 136. The third redistribution layer 148 may be formed with a layout based on the layout of the first redistribution layer 122, the first upper contacts 120, the second redistribution layer 136, and/or the second upper contacts 138. The layout of the third redistribution layer 148 may be formed based on the selected signal routings among the third lower contacts 146, and/or the third die 144. The layout of the third redistribution layer 148 may be formed based further on the selected signal routings of the first IC package 102 and/or the second IC package 104. In some embodiments, the third redistribution layer 148 may have a same layout as the first redistribution layer 122 and/or the second redistribution layer 136.

As illustrated in FIG. 1, the first IC package 102, the second IC package 104, and the third IC package 106 may be the same size. In these embodiments, the perimeter of the first IC package 102, the second IC package 104 and the third IC package 106 may be aligned when mounted in the IC package stack 100. In other embodiments, one or more of the first IC package 102, the second IC package 104 and the third IC package 106 may include a different height, a different width, and/or a different length than other IC packages within the IC package stack 100. In these embodiments, a portion of one or more of the IC packages in the IC package stack 100 may extend beyond perimeters of other IC packages within the IC package stack 100.

When the first IC package 102, the second IC package 104 and the third IC package 106 are mounted in the IC package stack 100, the second BGA 130 and the second under-fill layer 128 may be located between the upper side of the first IC package 102 and the lower side of the second IC package 104. Further, the third BGA 140 and the third under-fill layer 142 may be located between the upper side of the second IC package 104 and the lower side of the third IC package 106.

The first BGA 126 and the first under-fill layer 124 may be located between the lower side of the first IC package 102 and a circuit board onto which the IC package stack 100 is mounted.

The IC package stack 100 may provide many benefits over legacy IC packages. A benefit of the IC package stack 100 may include the ability to enable direct memory attachment to a system-on-chip package and/or a circuit board via flexible pitch routing through implementation of the IC package stack 100. Therefore, the IC package stack 100 may provide a near memory solution and/or enable thin system-in-package design.

Another benefit of the IC package stack 100 may include enabled integration of memory. The integration of memory may provide a path for low height of the IC package stack 100. In some embodiments, a substrate (such as the first substrate 112) may be eliminated from the IC package stack 100, which may further reduce height of the IC package stack 100 and/or reduce cost of producing the IC package stack 100.

Another benefit of the IC package stack 100 may be the omission of an over mold layer as may be included in many legacy IC package designs. The over mold layer of legacy IC package designs may involve formation of a molded layer over the assembled IC package for protection and/or isolation of the components within the legacy IC package. The IC package stack 100 may omit the over mold layer, which may save time and cost.

Figure 2:
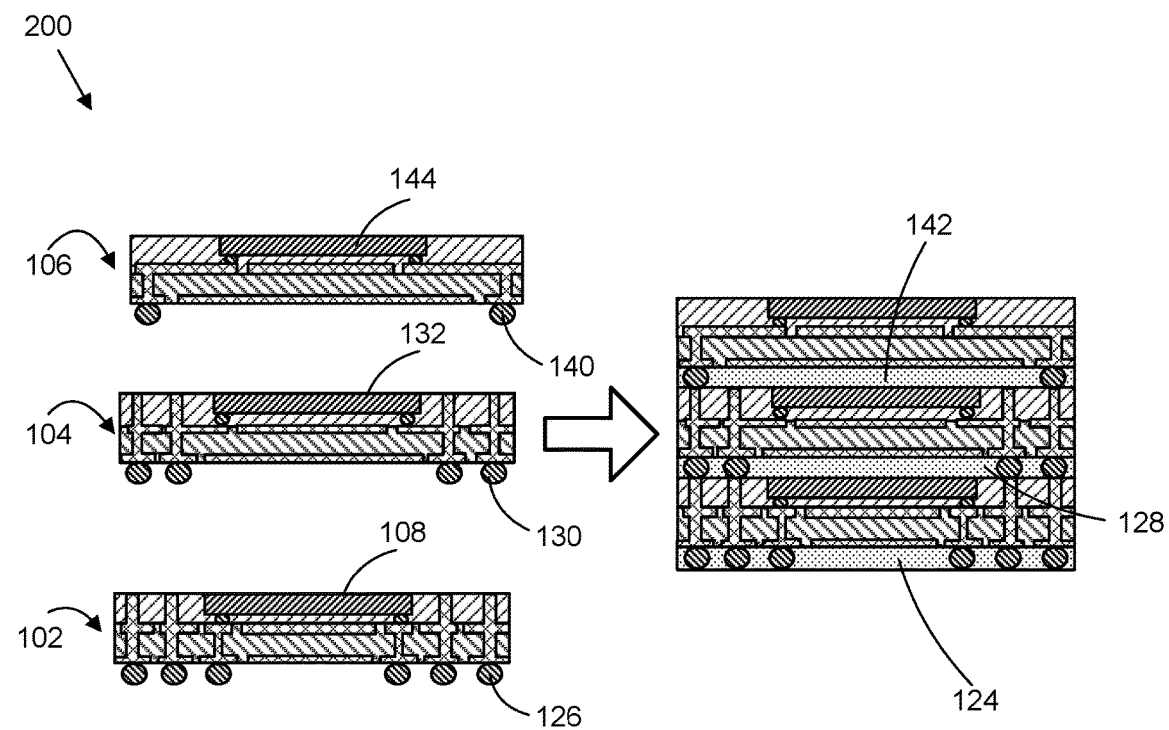
FIG. 2 illustrates an example integrated circuit package stack assembly procedure, according to various embodiments.

FIG. 2 illustrates an example IC package stack assembly procedure 200, according to various embodiments. The IC package stack assembly procedure 200 may include the first IC package 102, the second IC package 104 and the third IC package 106. The first IC package 102, the second IC package 104 and the third IC package 106 may be manufactured separately and mounted to each other and/or a circuit board after manufacture of the IC packages.

Prior to mounting the first IC package 102, the second IC package 104 and the third IC package 106 into the IC package stack 100, each of the first IC package 102, the second IC package 104 and the third IC package 106 may be tested for proper operation. Accordingly, through testing, the first die 108, the second die 132 and the third die 144 may be proven as known good dies (KGD) prior to mounting in the IC package stack 100. Accordingly, if one of the dies proves not to be a KGD, the die proven not to be a KGD may be disposed of prior to mounting in the IC package stack 100. The ability to test separate dies for being KGD may prevent disposing of an entire non-operational IC package stack 100 due to the failure of a portion of the dies within the IC package stack 100. Further, this approach may be more cost efficient than legacy IC packages with multiple dies within a single IC package.

The first BGA 126, the second BGA 130 and the third BGA 140 may be affixed to the lower side of the first IC package 102, the lower side of the second IC package 104, and the lower side of the third IC package 106, respectively. The first BGA 126, the second BGA 130 and/or the third BGA 140 may include one or more solder balls. In some embodiments, the first BGA 126, the second BGA 130 and/or the third BGA 140 may include a conductive material, such as a conductive adhesive and/or a conductive anisotropic film.

The first IC package 102, the second IC package 104 and the third IC package 106 may be placed in the configuration of the IC package stack 100, with the second BGA 130 between the first IC package 102 and the second IC package 104, and the third BGA 140 between the second IC package 104 and the third IC package 106. Heat may be applied to the first BGA 126, the second BGA 130, and/or the third BGA 140, which may cause the IC packages to become communicatively coupled. As the first BGA 126, the second BGA 130, and/or the third BGA 140 cool, the BGAs may affix the IC packages together.

In some embodiments, the IC package stack 100 may be placed on a circuit board prior to heating and the heat may be applied to the first BGA 126 communicatively coupling and affixing the IC package stack 100 to the circuit board. In some embodiments, the IC package stack 100 may be placed on the circuit board after the initial heating of the BGAs and a second heating process may be applied to the first BGA 126 communicatively coupling and affixing the IC package stack 100 to the circuit board. Further, in some embodiments, the IC packages may be communicatively coupled and affixed to each other through heating of a single BGA at a time. For example, the first IC package 102 may be communicatively coupled and affixed, via a first heating process, to the circuit board, the second IC package 104 may be communicatively coupled and affixed, via a second heating process, to the first IC package 102, and so forth.

After the IC packages of the IC package stack 100 have been communicatively coupled and affixed, the first under-fill layer 124, the second under-fill layer 128 and the third under-fill layer 142 may be formed on the IC package stack. The first under-fill layer 124 may be formed between the first IC package 102 and the circuit board to which the IC package stack 100 is affixed. The second under-fill layer 128 may be formed between the first IC package 102 and the second IC package 104. The third under-fill layer 142 may be formed between the second IC package 104 and the third IC package 106. The first under-fill layer 124, the second under-fill layer 128 and the third under-fill layer 142 may all be formed in a single under-fill process or each under-fill layer may be formed in separate under-fill processes.

While the IC package stack 100 of FIG. 2 is illustrated with three IC packages, it is to be understood that the IC package stack assembly procedure 200 may be applied to any number of IC packages within the IC package stack 100. In some embodiments, one or more of the features of the IC package stack assembly procedure 200 may be repeated based on the number of IC packages within the IC package stack 100.

Figure 3:
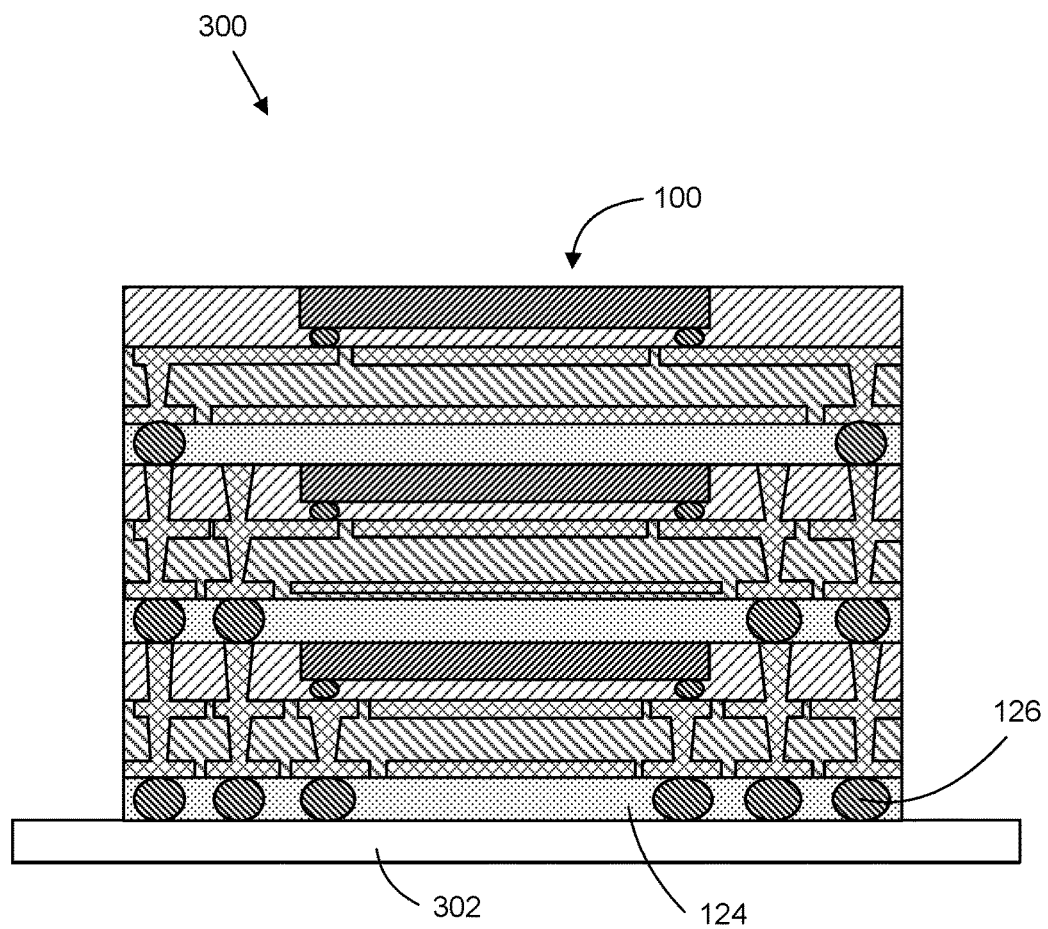
FIG. 3 illustrates an example IC package stack configuration with the integrated circuit package stack of FIG. 1 mounted to a circuit board, according to various embodiments.

FIG. 3 illustrates an example IC package stack configuration 300 with the IC package stack 100 of FIG. 1 mounted to a circuit board 302, according to various embodiments. The IC package stack 100 may include one or more of the features described in relation to FIG. 1. The IC package stack 100 may be affixed to the circuit board 302 by the first BGA 126 and/or the first under-fill layer 124. The IC package stack 100 may be affixed to the circuit board 302 by one or more of the features described in relation to the IC package stack assembly procedure 200 of FIG. 2.

The circuit board 302 may include any type of circuit board known to one having ordinary skill in the art. The circuit board 302 may be a printed circuit board, a single-sided circuit board, a double-sided circuit board, a multi-layer circuit board, a flexible circuit board, or some combination thereof. The circuit board 302 may include one or more traces that communicatively couple the IC package stack 100 to other components on the circuit board 302. The first BGA 126 may be aligned with contacts on the circuit board 302 and may communicatively couple the IC package stack 100 to the traces of the circuit board 302.

Figure 4:
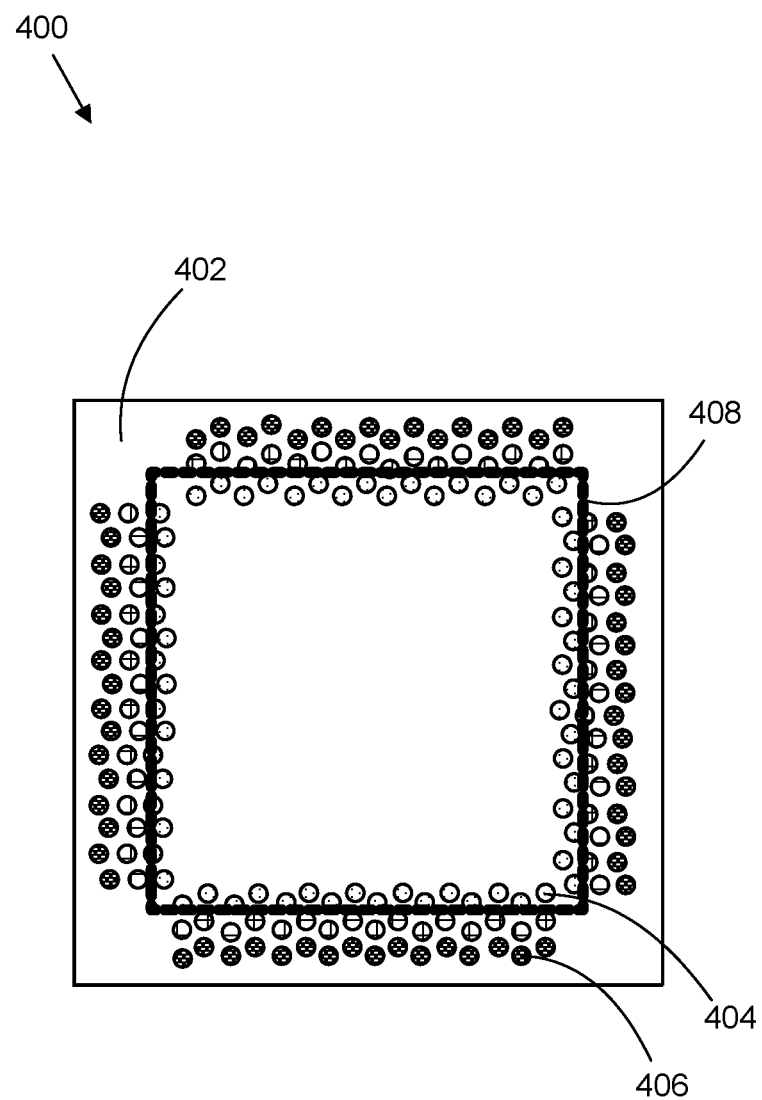
FIG. 4 illustrates an example redistribution layer contact layout for an integrated circuit package for use in an integrated circuit package stack, according to various embodiments.

FIG. 4 illustrates an example redistribution layer contact layout 400 for an IC package for use in an IC package stack, according to various embodiments. The redistribution layer contact layout 400 may be representative of contact layouts for one or more of the first redistribution layer 122, the second redistribution layer 136, and/or the third redistribution layer 148 of FIG. 1.

The redistribution layer contact layout 400 may include a redistribution layer 402. The redistribution layer 402 may include one or more contacts, including die contacts 404 and/or pass-through contacts 406. The die contacts 404 may be located within a perimeter outline 408 of a die, such as the first die 108, the second die 132, and/or the third die 144 of FIG. 1. The die contacts 404 may be communicatively coupled to a die mounted in a same IC package as the redistribution layer 402. The die contacts 404, along with traces of the redistribution layer 402, may route signals among contacts (such as the first lower contacts 118, the first upper contacts 120, the second lower contacts 134, the second upper contacts 138, the third lower contacts 146 of FIG. 1) of an IC package, redistribution layer 402, and/or the die.

The pass-through contacts 406 may be communicatively coupled to vias (such as the first upper vias 114 and/or the first lower vias 116 of FIG. 1) that route signals, through the IC package, between contacts on an upper side of the die and contacts on a lower side of the die. The pass-through contacts 406 may be used for propagating common power rails among IC packages within an IC package stack (such as IC package stack 100 of FIG. 1). The pass-through contacts 406 may be used for propagating signals through the IC package with the redistribution to other IC packages within the IC package stack.

In some embodiments, the die contacts 404 and the pass-through contacts 406 may be communicatively coupled to vias within a substrate (such as the first substrate 112 of FIG. 1), which may, in turn, be communicatively coupled to one or more contacts on a lower side of the IC package. The pass-through contacts 406 may be communicatively coupled to vias within a molded layer (such as the first molded layer 110 of FIG. 1), which may, in turn, be communicatively coupled to one or more contacts on an upper side of the IC package.

In some embodiments, the die contacts 404 and/or the pass through-contacts 406 may include solder bumps. The solder bumps may be utilized for coupling the die contacts 404 and/or the pass-through contacts 406 to the vias and/or the die. The solder bumps may be heated while in contact with the vias and/or die and cooled to communicatively couple and/or affix the redistribution layer 402 to the vias and/or die.

In some embodiments, the redistribution layer 402 may have a length of approximately 11 millimeters and a width of approximately 11 millimeters. The die to be mounted to the redistribution layer 402 may have a length of approximately 10 millimeters and a width of approximately 10 millimeters. The lengths and/or widths may vary by less than 5 millimeters in either direction. The redistribution layer 402 may have a depth between approximately 400 micrometers and 500 micrometers.

Figure 5:
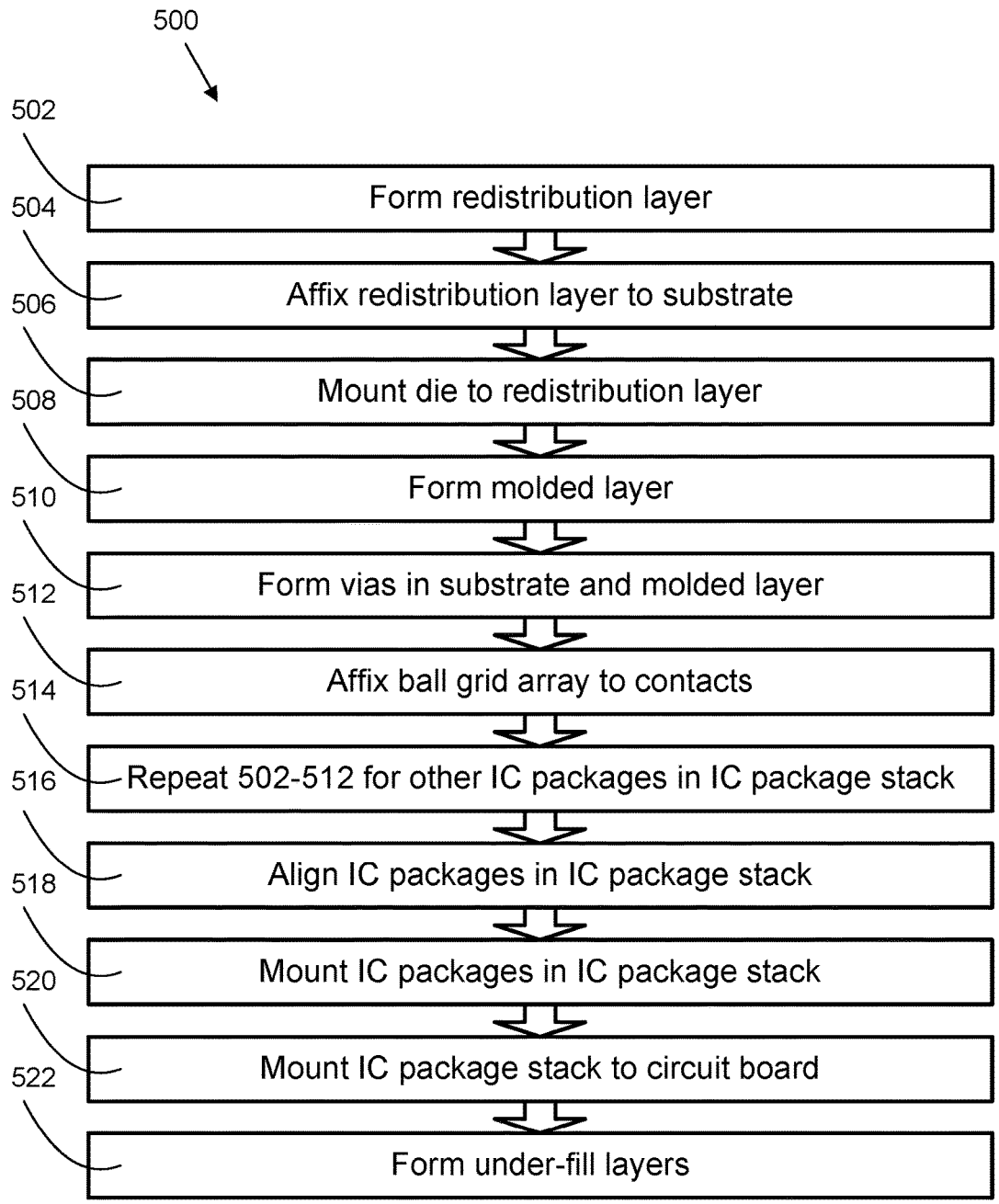
FIG. 5 illustrates an example integrated circuit package stack production process, according to various embodiments.

FIG. 5 illustrates an example IC package stack production process 500, according to various embodiments. The IC package stack production process 500 may produce an IC package stack, such as IC package stack 100 of FIG. 1.

In 502, a redistribution layer is formed. The redistribution layer may include one or more of the features of the first redistribution layer 122, the second redistribution layer 136, and/or the third redistribution layer 148. A layout of the redistribution layer may be formed based on a desired routing of signals from contacts on a lower side of an IC package (such as the first IC package 102, the second IC package 104, and/or the third IC package 106 of FIG. 1), that is to include the redistribution layer, to contacts on an upper side of the IC package and/or to a die, that is to be mounted to the redistribution layer.

In 504, the redistribution layer may be affixed to a substrate. The substrate may include one or more of the features of the first substrate 112 of FIG. 1. The redistribution layer may be affixed to the substrate by any means of affixing a redistribution layer to a substrate known by one having ordinary skill in the art. A first side of the redistribution layer may be affixed to the substrate.

In 506, a die may be mounted to the redistribution layer. The die may include one or more of the features of the first die 108, the second die 132, and/or the third die 144 of FIG. 1. The die may be aligned with the redistribution layer, such that contacts of the die align with corresponding contacts of the redistribution layer. One or more solder balls may affix the contacts of the die to the contact of the redistribution layer, thereby affixing the die to the redistribution layer. The solder balls may further communicatively couple the die to the redistribution layer.

In 508, a molded layer may be formed on the redistribution layer. The molded layer may include one or more of the features of the first molded layer 110. The molded layer may be formed by any means of forming a molded layer known by one having ordinary skill in the art. The molded layer may be formed on a second side of the redistribution layer, the second side opposite to the first side of the redistribution layer.

In 510, one or more vias may be formed in the substrate and/or the molded layer. The vias may include one or more features of the first lower vias 116 and/or the first upper vias 114. The vias may extend from the redistribution layer to a lower side of the IC package and/or from the redistribution layer to an upper side of the IC package, the upper side opposite to the lower side. Contacts of the IC package may be formed where the vias contact the lower side of the IC package and/or where the vias contact the upper side of the IC package.

In 512, a BGA may be affixed to one or more contacts on the lower side of the IC package. The BGA may include one or more of the features of the first BGA 126, the second BGA 130, and/or the third BGA 140. The BGA may include one or more solder balls. In some embodiments, the BGA may include a conductive adhesive, a conductive anisotropic, or some combination thereof.

In 514, 502-512 may be repeated for other IC packages within the IC package stack being produced. The other IC packages may include one or more of the features of the first IC package 102, the second IC package 104, and/or the third IC package 106.

In 516, the IC packages, in the IC package stack being produced, are aligned. Alignment of the IC package may include one or more of the features of and/or may be aligned in accordance with the alignment of the IC package stack 100 of FIG. 1. The IC packages may be aligned such that contacts on an upper side of each IC package stack with contacts on a lower side of an adjacent IC package. In some embodiments, the IC packages may be aligned such that perimeters of each of the IC packages are in-line in a vertical direction, such that an upper side of one IC package abuts a lower side of another IC package.

In 518, the IC packages are mounted in the IC package stack. Heat may be applied to the BGA of each of the IC packages while the IC packages are aligned. In response to the heat being applied to the BGA, the BGA may communicatively couple adjacent IC packages together. As the BGA cools, the BGA may harden and affix the adjacent IC packages together. The resultant IC package stack may include one or more of the features of the IC package stack 100 of FIG. 1.

In 520, the IC package stack may be mounted to a circuit board. The circuit board may include one or more of the features of the circuit board 302 of FIG. 3. The IC package stack may be mounted to the circuit board by aligning contacts of the bottom IC package of the IC package stack with corresponding contacts on the circuit board. Heat may be applied to the BGA of the bottom IC package and the IC package stack may be communicatively coupled to the circuit board as the BGA is heated. As the BGA cools, the BGA may harden and affix the IC package stack to the circuit board.

In 522, under-fill layers may be formed in the IC package stack. The under-fill layers may include one or more of the features of the first under-fill layer 124, the second under-fill layer 128, and/or the third under-fill layer 142. The under-fill layers may be formed between the IC packages within the IC package stack and/or between the bottom IC package of the IC package stack and the circuit board. In some embodiments, the under-fill layers between the IC packages within the IC package stack may be formed prior to the IC package stack being mounted to the circuit board and the under-fill layers between the bottom IC package and the circuit board may be formed after the IC package stack is mounted to the circuit board.

Figure 6:
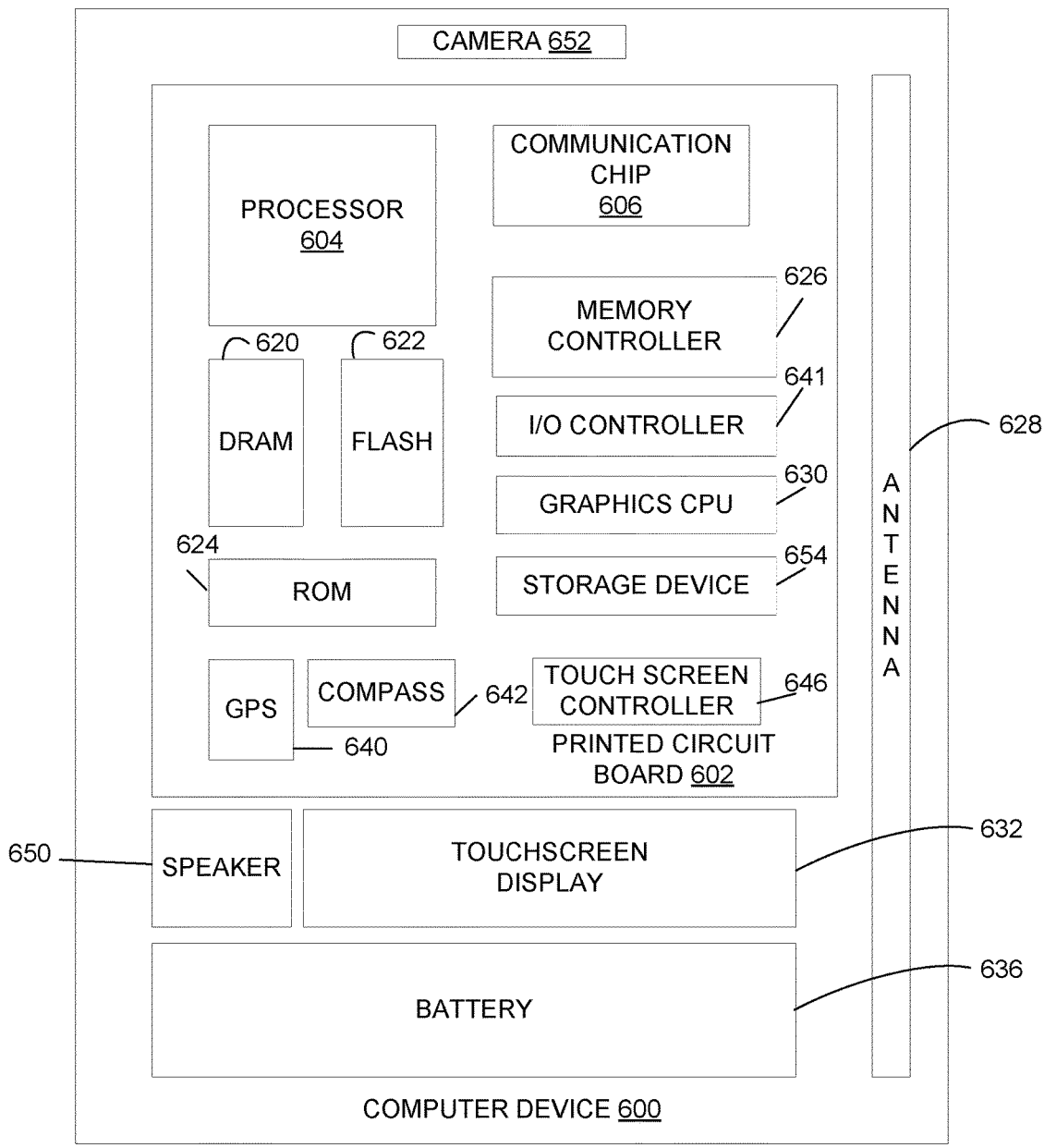
FIG. 6 illustrates an example computing device that may employ the apparatuses and/or methods described herein.

FIG. 6 illustrates an example computer device 600 that may employ the apparatuses and/or methods described herein (e.g., the IC package stack 100 of FIG. 1), in accordance with various embodiments. As shown, computer device 600 may include a number of components, such as one or more processor(s) 604 (one shown) and at least one communication chip 606. In various embodiments, the one or more processor(s) 604 each may include one or more processor cores. In various embodiments, the at least one communication chip 606 may be physically and electrically coupled to the one or more processor(s) 604. In further implementations, the communication chip 606 may be part of the one or more processor(s) 604. In various embodiments, computing device 600 may include printed circuit board (PCB) 602. For these embodiments, the one or more processor(s) 604 and communication chip 606 may be disposed thereon. In alternate embodiments, the various components may be coupled without the employment of PCB 602.

Depending on its applications, computer device 600 may include other components that may or may not be physically and electrically coupled to the PCB 602. These other components include, but are not limited to, memory controller 626, volatile memory (e.g., dynamic random access memory (DRAM) 620), non-volatile memory such as read only memory (ROM) 624, flash memory 622, storage device 654 (e.g., a hard-disk drive (HDD)), an I/O controller 641, a digital signal processor (not shown), a crypto processor (not shown), a graphics processor 630, one or more antenna 628, a display (not shown), a touch screen display 632, a touch screen controller 646, a battery 636, an audio codec (not shown), a video codec (not shown), a global positioning system (GPS) device 640, a compass 642, an accelerometer (not shown), a gyroscope (not shown), a speaker 650, a camera 652, and a mass storage device (such as hard disk drive, a solid state drive, compact disk (CD), digital versatile disk (DVD)) (not shown), and so forth.

In some embodiments, the one or more processor(s) 604, flash memory 622, and/or storage device 654 may include associated firmware (not shown) storing programming instructions configured to enable computer device 600, in response to execution of the programming instructions by one or more processor(s) 604, to practice all or selected aspects of the methods described herein. In various embodiments, these aspects may additionally or alternatively be implemented using hardware separate from the one or more processor(s) 604, flash memory 622, or storage device 654.

In various embodiments, one or more components of the computer device 600 may include and/or implement the IC package stack 100 described herein. For example, the IC package stack 100 may be included and/or implemented within the DRAM 620, the flash memory 622, the ROM 624, the storage device 654, the processor 604, the communication chip 606, the memory controller 626, the I/O controller 641, the graphics CPU 630, and/or the touch screen controller 646.

The communication chips 606 may enable wired and/or wireless communications for the transfer of data to and from the computer device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to IEEE 802.20, Long Term Evolution (LTE), LTE Advanced (LTE-A), General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 4G, 5G, and beyond. The computer device 600 may include a plurality of communication chips 606. For instance, a first communication chip 606 may be dedicated to shorter range wireless communications such as Wi-Fi and Bluetooth, and a second communication chip 606 may be dedicated to longer range wireless communications such as GPS, EDGE, GPRS, CDMA, WiMAX, LTE, Ev-DO, and others.

In various implementations, the computer device 600 may be a laptop, a netbook, a notebook, an ultrabook, a smartphone, a computing tablet, a personal digital assistant (PDA), an ultra-mobile PC, a mobile phone, a desktop computer, a server, a printer, a scanner, a monitor, a set-top box, an entertainment control unit (e.g., a gaming console or automotive entertainment unit), a digital camera, an appliance, a portable music player, or a digital video recorder. In further implementations, the computer device 600 may be any other electronic device that processes data.

Example 1 may include an integrated circuit (IC) package stack, comprising a first IC package, a first side of the first IC package to be mounted to a circuit board, the first IC package includes a first die and a first redistribution layer that communicatively couples contacts on the first side of the first IC package to the first die and to contacts on a second side of the first IC package, the second side opposite to the first side, and a second IC package mounted to the second side of the first IC package, the second IC package includes a second die and a second redistribution layer that communicatively couples contacts on a side of the second IC package to the second die, the contacts of the second IC package communicatively coupled to the contacts on the second side of the first IC package.

Example 2 may include the IC package stack of example 1, further comprising a ball grid array (BGA) located between the second side of the first IC package and the side of the second IC package, wherein the BGA communicatively couples the contacts on the second side of the first IC package to the contacts of the second IC package.

Example 3 may include the IC package stack of example 1, further comprising under-fill material located between the second side of the first IC package and the side of the second IC package.

Example 4 may include the IC package stack of example 1, wherein a layout of the first redistribution layer is different than a layout of the second redistribution layer.

Example 5 may include the IC package stack of any of the examples 1-4, wherein the first IC package further includes a first set of vias that communicatively couples the contacts on the first side of the first IC package to the first redistribution layer, and a second set of vias that communicatively couples the first redistribution layer to the contacts on the second side of the first IC package, wherein the first set of vias are formed within a substrate of the first IC package and the second set of vias are formed within a molded layer of the first IC package.

Example 6 may include the IC package stack of example 5, wherein the first set of vias extend from the contacts on the first side of the first IC package to the first redistribution layer, and wherein the first set of vias are formed around the first die.

Example 7 may include the IC package stack of example 5, wherein the second IC package further includes a set of vias that communicatively couple the contacts of the second IC package to the second redistribution layer.

Example 8 may include the IC package stack of example 7, wherein the second IC package further includes a second set of vias that communicatively couple the second redistribution layer to contacts on a second side of the second IC package, the second side of the second IC package opposite to the first side of the second IC package, and wherein the IC package stack further includes a third IC package, the third IC package mounted to the second side of the second IC package, the third IC package includes a third die and a third redistribution layer that communicatively couples contacts on a side of the third IC package to the third die, the contacts of the third IC package communicatively coupled to the contacts on the second side of the second IC package.

Example 9 may include the IC package stack of example 8, wherein a layout of the third redistribution layer is different than a layout of the second redistribution layer, and wherein the layout of the third redistribution layer is different than a layout of the first redistribution layer.

Example 10 may include the IC package stack of any of the examples 1-4, wherein the first die is located between the first redistribution layer and the second side of the first IC package.

Example 11 may include the IC package stack of any of the examples 1-4, wherein a type of the first die is same as a type of the second die.

Example 12 may include the IC package stack of any of the examples 1-4, wherein a type of the first die is different than a type of the second die.

Example 13 may include the IC package stack of any of the examples 1-4, wherein the first die and the second die are memory dies.

Example 14 may include the IC package stack of any of the examples 1-4, wherein the first IC package and the second IC package are flip-chip packages.

Example 15 may include a method of forming an integrated circuit (IC) package stack, comprising aligning contacts on a first side of a second IC package with contacts on a first side of a first IC package, the first IC package having a second side, opposite to the first side of the first IC package, to couple the first IC package to a circuit board, coupling the contacts on the first side of the second IC package with the contacts on the first side of the first IC package via one or more electrically conductive mechanisms, and forming an under-fill layer between the first side of the second IC package and the first side of the first IC package.

Example 16 may include the method of example 15, further comprising forming one or more vias in the first IC package from a first redistribution layer of the first IC package to the contacts on the first side of the first IC package, and forming one or more vias in the second IC package from a second redistribution layer of the second IC package to the contacts on the first side of the second IC package, the one or more vias in the second IC package to align with the one or more vias in the first IC package when aligning a perimeter of the second IC package with a perimeter of the first IC package.

Example 17 may include the method of example 16, further comprising forming one or more vias in the second IC package from the second redistribution layer to contacts on a second side, opposite to the first side of the second IC package, of the second IC package, aligning contacts on a first side of a third IC package with the contacts on the second side of the second IC package, coupling the contacts on the first side of the third IC package with the contacts on the second side of the second IC package, and forming a second under-fill layer between the first side of the third package and second side of the second IC package.

Example 18 may include the method of any of the examples 15-17, wherein coupling the contacts on the first side of the second IC package with the contacts on the first side of the first IC package includes forming a ball grid array (BGA) on either the contacts on the first side of the second IC package or the contacts on the first side of the first IC package, and heating the BGA when the contacts on the first side of the second IC package are aligned with the contacts on the first side of the first IC package, wherein the BGA couples the contacts of the first side of the second IC package with the contacts on the first side of the first IC package based on the heating.

Example 19 may include the method of any of the examples 15-17, further comprising forming a first redistribution layer to route signals from contacts on the second side of the first IC package to the contacts on the first side of the first side of the first IC package, forming the first IC package with the first redistribution layer, forming a second redistribution layer to route signals from the contacts on the first side of the second IC package to a second die of the second IC package, and forming the second IC package with the second redistribution.

Example 20 may include a system, comprising a circuit board and an integrated circuit (IC) package stack communicatively coupled to the circuit board, the IC package stack including a first IC package, a first side of the first IC package coupled to the circuit board, the first IC package includes a first die and a first redistribution layer that communicatively couples, via one or more vias, one or more contacts on the first side of the first IC package to one or more contacts on a second side, opposite to the first side of the first IC package, of the first IC package, and a second IC package mounted to the second side of the first IC package, the second IC package including a second die and a second redistribution layer that communicatively couples, via one or more vias, one or more contacts on a side of the second IC package to the second die, the one or more contacts on the side of the second IC package communicatively coupled to the one or more contacts on the second side of the first IC package.

Example 21 may include the system of example 20, further comprising a ball grid array (BGA) located between the second side of the first IC package and the side of the second IC package, wherein the BGA communicatively couples the one or more vias of the first IC package to the one or more vias of the second IC package.

Example 22 may include the system of any of the examples 20 and 21, wherein the one or more vias of the first IC package are formed in a substrate and a molded layer of the first IC package, and wherein the one or more vias of the second IC package are formed in a substrate and a molded layer of the second IC package.

Example 23 may include the system of any of the examples 20 and 21, wherein the first redistribution layer further communicatively couples, via the one or more vias, the one or more contacts on the first side of the first IC package to the first die.

Example 24 may include the system of any of the examples 20 and 21, wherein the second redistribution layer further communicatively couples, via the one or more vias, the one or more contacts on the side of the second IC package to one or more contacts on a second side, opposite to the side of the second IC package, of the second IC package, and wherein the IC package stack further includes a third IC package mounted to the second side of the second IC package, the third IC package includes a third die and a third redistribution layer that communicatively couples, via one or more vias, one or more contacts on a side of the third IC package to the third die, wherein the one or more contacts on the side of the third IC package are communicatively coupled to the one or more contacts on the second side of the second IC package.

Example 25 may include the system of any of the examples 20 and 21, wherein the first die is located between the first redistribution layer and the second side of the first IC package.

Example 26 may include the system of any of the examples 20 and 21, wherein a type of the first die is same as a type of the second die.

Example 27 may include the system of any of the examples 20 and 21, wherein a type of the first die is different than a type of the second die.

Example 28 may include the system of any of the examples 20 and 21, wherein the first die and the second die are memory dies.

Example 29 may include the system of any of the examples 20 and 21, wherein the first IC package and the second IC package are flip-chip packages.

It will be apparent to those skilled in the art that various modifications and variations can be made in the disclosed embodiments of the disclosed device and associated methods without departing from the spirit or scope of the disclosure. Thus, it is intended that the present disclosure covers the modifications and variations of the embodiments disclosed above provided that the modifications and variations come within the scope of any claims and their equivalents.

What is claimed is:

1. An integrated circuit (IC) package stack, comprising:
   a first IC package, a first side of the first IC package to be mounted to a circuit board, the first IC package includes:
      a first die;
      a first redistribution layer that communicatively couples contacts on the first side of the first IC package to the first die and to contacts on a second side of the first IC package, the second side opposite to the first side;
      a first set of vias that communicatively couples the contacts on the first side of the first IC package to the first redistribution layer; and
      a second set of vias that communicatively couples the first redistribution layer to the contacts on the second side of the first IC package, wherein the first set of vias are formed within a substrate of the first IC package and the second set of vias are formed within a molded layer of the first IC package; and
   a second IC package mounted to the second side of the first IC package, the second IC package includes:
      a second die;
      a second redistribution layer that communicatively couples contacts on a side of the second IC package to the second die, the contacts of the second IC package communicatively coupled to the contacts on the second side of the first IC package.

2. The IC package stack of claim 1, further comprising a ball grid array (BGA) located between the second side of the first IC package and the side of the second IC package, wherein the BGA communicatively couples the contacts on the second side of the first IC package to the contacts of the second IC package.

3. The IC package stack of claim 1, further comprising under-fill material located between the second side of the first IC package and the side of the second IC package.

4. The IC package stack of claim 1, wherein a layout of the first redistribution layer is different than a layout of the second redistribution layer.

5. The IC package stack of claim 1, wherein the first set of vias extend from the contacts on the first side of the first IC package to the first redistribution layer, and wherein the first set of vias are formed around the first die.

6. The IC package stack of claim 1, wherein the second IC package further includes: a set of vias that communicatively couple the contacts of the second IC package to the second redistribution layer.

7. The IC package stack of claim 6, wherein the second IC package further includes a second set of vias that communicatively couple the second redistribution layer to contacts on a second side of the second IC package, the second side of the second IC package opposite to the first side of the second IC package, and wherein the IC package stack further includes:
   a third IC package, the third IC package mounted to the second side of the second IC package, the third IC package includes:
      a third die; and
      a third redistribution layer that communicatively couples contacts on a side of the third IC package to the third die, the contacts of the third IC package communicatively coupled to the contacts on the second side of the second IC package.

8. The IC package stack of claim 7, wherein a layout of the third redistribution layer is different than a layout of the second redistribution layer, and wherein the layout of the third redistribution layer is different than a layout of the first redistribution layer.

9. The IC package stack of claim 1, wherein the first die is located between the first redistribution layer and the second side of the first IC package.

10. A system, comprising:
   a circuit board; and
   an integrated circuit (IC) package stack communicatively coupled to the circuit board, the IC package stack including:
      a first IC package, a first side of the first IC package coupled to the circuit board, the first IC package includes:
         a first die;
         a first redistribution layer that communicatively couples one or more contacts on the first side of the first IC package to one or more contacts on a second side of the first IC package, the second side of the first IC package opposite to the first side of the first IC package;
         a first set of vias that communicatively couples the one or more contacts on the first side of the first IC package to the first redistribution layer; and
         a second set of vias that communicatively couples the first redistribution layer to the one or more contacts on the second side of the first IC package, wherein the first set of vias are formed within a substrate of the first IC package and the second set of vias are formed within a molded layer of the first IC Package; and
      a second IC package mounted to the second side of the first IC package, the second IC package including:
         a second die; and
         a second redistribution layer that communicatively couples, via one or more vias, one or more contacts on a side of the second IC package to the second die, the one or more contacts on the side of the second IC package communicatively coupled to the one or more contacts on the second side of the first IC package.

11. The system of claim 10, further comprising a ball grid array (BGA) located between the second side of the first IC package and the side of the second IC package, wherein the BGA communicatively couples the second set of vias of the first IC package to the one or more vias of the second IC package.

12. The system of claim 10, wherein the one or more vias of the second IC package are formed in a substrate and a molded layer of the second IC package.

13. The system of claim 10, wherein the first redistribution layer further communicatively couples the one or more contacts on the first side of the first IC package to the first die.

14. The system of claim 10, wherein the second redistribution layer further communicatively couples, via the one or more vias, the one or more contacts on the side of the second IC package to one or more contacts on a second side of the second IC package, the second side of the IC package opposite to the side of the second IC package, and wherein the IC package stack further includes:
   a third IC package mounted to the second side of the second IC package, the third IC package includes:
      a third die; and
      a third redistribution layer that communicatively couples, via one or more vias, one or more contacts on a side of the third IC package to the third die, wherein the one or more contacts on the side of the third IC package are communicatively coupled to the one or more contacts on the second side of the second IC package.

* * * * *